(12) United States Patent
Lebourg et al.

(10) Patent No.: US 8,928,340 B2
(45) Date of Patent: Jan. 6, 2015

(54) DIGITAL CIRCUIT TESTABLE THROUGH TWO PINS

(75) Inventors: Philippe Lebourg, Saint Paul de Varces (FR); Paul Armagnat, Seyssinet (FR); Thomas Droniou, Grenoble (FR)

(73) Assignees: STMicroelectronics SA, Montrouge (FR); STMicroelectronics (Grenoble 2) SAS, Grenoble (FR)

( * ) Notice: Subject to any disclaimer, the term of this patent is extended or adjusted under 35 U.S.C. 154(b) by 470 days.

(21) Appl. No.: 13/338,053

(22) Filed: Dec. 27, 2011

(65) Prior Publication Data

US 2012/0161802 A1      Jun. 28, 2012

(30) Foreign Application Priority Data

Dec. 27, 2010   (FR) ...................................... 10 05130

(51) Int. Cl.
*G01R 31/26*   (2014.01)
*G01R 31/3185*   (2006.01)

(52) U.S. Cl.
CPC .............................. *G01R 31/318572* (2013.01)
USPC ............... 324/750.01; 324/750.3; 324/762.02

(58) Field of Classification Search
None
See application file for complete search history.

(56) References Cited

U.S. PATENT DOCUMENTS

| 5,682,392 | A  | * | 10/1997 | Raymond et al. ............. 714/727 |
| 7,739,566 | B2 |   | 6/2010  | Armagnat |
| 2007/0167785 | A1 |   | 7/2007  | Harrod et al. |
| 2007/0260953 | A1 |   | 11/2007 | Armagnat |
| 2009/0132879 | A1 |   | 5/2009  | Gangappa |

FOREIGN PATENT DOCUMENTS

EP     1 813 952 A1    8/2007

* cited by examiner

*Primary Examiner* — Minh N Tang
(74) *Attorney, Agent, or Firm* — Seed IP Law Group PLLC (57) ABSTRACT

A method for scan-testing of an integrated circuit includes the following steps carried out by the circuit itself: upon powering on of the circuit, watching for bit sequences applied to a use pin configured for receiving serial data from the exterior at the rate of a clock signal applied to a clock pin; configuring the circuit in a test mode when a bit sequence is identified as a test initialization sequence; connecting latches of the circuit in a shift register configuration, and connecting the shift register for receiving a test vector in series from the use pin; switching the transfer direction of the use pin to the output mode for providing to the exterior serial data at the rate of the clock signal; and connecting the shift register for providing its content, as a test result set, in series on the use pin.

28 Claims, 3 Drawing Sheets

DIGITAL CIRCUIT TESTABLE THROUGH TWO PINS

BACKGROUND

1. Technical Field

This disclosure relates to the scan-test of digital integrated circuits, such as integrated circuits having a low pin count.

2. Description of the Related Art

Figure 1:
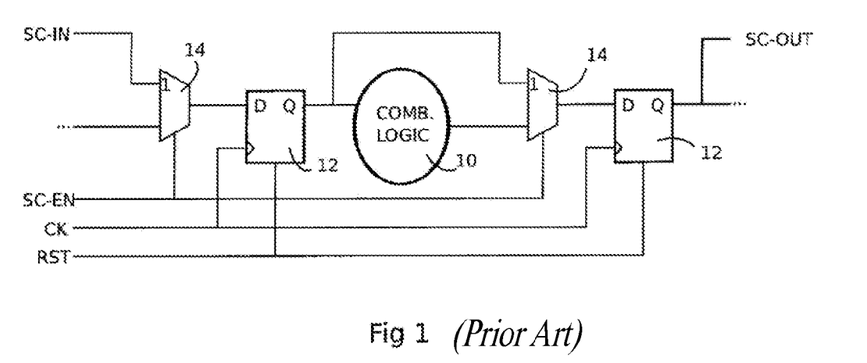
FIG. 1, previously described, schematically shows a portion of a scan-testable digital integrated circuit.

FIG. 1 is intended to illustrate a conventional scan-test principle. A digital integrated circuit may be decomposed in subsets of combinatorial logic functions 10 connected together by flip-flops 12, usually latches, clocked by a common clock CK. Latches 12 are also connected to a common reset line RST.

In order to test the circuit, normal operation of the circuit is interrupted in order to place known values in the latches 12 through a mechanism described hereinafter. Normal operation of the circuit is then resumed for a number of clock cycles CK, after which the circuit is again stopped in order to retrieve the states of the latches through the same mechanism and compare them to expected values.

In order to write test values, or a test vector, in latches 12 of the circuit to test, the circuit is placed in a scan mode by a scan-enable signal SC-EN. In this mode, the latches 12 are connected in a shift register configuration, typically through multiplexers 14. Each latch 12 in this case is preceded by a multiplexer 14 having a first input receiving the signal normally intended for the data input of the latch, provided by a subset of combinatorial logic 10. A second input of the multiplexer, selected by the active state (1) of signal SC-EN, is connected to the output of the preceding latch 12.

Thus, when signal SC-EN is active, the latches are chained in a shift register configuration, clocked by clock CK. The second input of the first multiplexer of the chain forms the scan-in input SC-IN of the shift register, through which the test vector is introduced in series. The test vector has one bit for each latch. The output of the last latch of the chain forms the scan-out output SC-OUT of the shift register, through which is extracted in series the test result set corresponding to the last introduced test vector.

Between the introduction of a test vector and the extraction of a test result set, signal SC-EN may be disabled to let the circuit operate normally during one or several clock cycles with the values of the test vector as initial values in the latches. This operation produces new values in the latches, forming the result set that is extracted when signal SC-EN is again enabled.

It appears that this test technique requires five signals, SC-IN, SC-OUT, SC-EN, CK and RST. These five signals should normally be available on distinct pins of the circuit to test. This happens to be what the JTAG standard (IEEE std 1149.1) specifies, in defining communication protocols according to a similar principle. The clock and reset pins CK, RST, are available on most digital integrated circuits. The signals SC-IN and SC-OUT may correspond with two input/output pins of the circuit, the roles of which may be configured by commands provided on an additional pin dedicated to the test configuration, usually called TMC (Test Mode Configuration). The circuit thus has a minimum of 8 pins, including two power supply pins.

In some digital circuits it is desirable to reduce the pin count, especially of the pins dedicated to the test. U.S. Pat. No. 7,739,566 discloses a solution reducing the pin count to five, including two power supply pins, two input/output pins, and a clock pin. One of the input/output pins is used for receiving both the test commands and the test vectors, and the other input/output pin is used for extracting the test results. The signal determining the scan and capture phases (SC-EN) is generated internally by a state-machine in response to commands received on the input pin.

BRIEF SUMMARY

Digital circuits exist that have only four pins, namely two power supply pins, a clock pin, and a single use pin. These circuits may be complex, and it may be desirable to scan-test them. Such circuits may be sensors providing measured values at regular intervals. There is thus a need for a solution for scan-testing digital integrated circuits having, in addition to the power supply pins, only two signal pins, for instance a clock pin and a use pin.

In an embodiment, a method for scan-testing of an integrated circuit comprises the following steps carried out by the circuit itself:

upon powering on of the circuit, watching for bit sequences applied to a use pin configured for receiving serial data from the exterior at the rate of a clock signal applied to a clock pin;

configuring the circuit in a test mode when a bit sequence is identified as a test initialization sequence;

connecting latches of the circuit in a shift register configuration, and connecting the shift register for receiving a test vector in series from the use pin;

switching the transfer direction of the use pin to an output mode for providing to the exterior serial data at the rate of the clock signal; and connecting the shift register for providing its content, as a test result set, in series on the use pin.

According to an embodiment, the transfer direction of the use pin is switched at each clock cycle in order to alternate the input of a bit of the test vector and the output of a bit of the result set through the use pin.

According to an embodiment, transfer direction of the use pin stays unchanged during a number of consecutive clock cycles corresponding to the test vector size.

According to an embodiment, switching of the transfer direction of the use pin is synchronized on the logic complement of the clock signal.

According to an embodiment, the method comprises the following steps carried out by the circuit itself:

between the end of the reception of a test vector and the beginning of the provision of the result set, performing a capture phase by reconnecting the latches in their normal operation configuration during one or more clock cycles; and synchronizing the beginning and the end of the capture phase on the logic complement of the clock signal.

According to an embodiment, the circuit determines the size of the test vectors from information conveyed in the test initialization sequence.

According to an embodiment, the circuit determines the number of cycles of the capture phase from information conveyed in the test initialization sequence.

According to an embodiment, the circuit determines the end of a test from a surplus bit conveyed in the test vectors.

According to an embodiment, the method comprises the following steps carried out by the circuit itself:

configuring the circuit in a self-test mode when the bit sequence on the use pin identifies a self-test;

performing a self-test according to parameters conveyed in the test initialization sequence;

switching the transfer direction of the use pin to the output mode; and providing in series on the use pin a combination of the values contained in latches of the circuit.

In an embodiment, a method comprises: responding to powering on of an integrated circuit by configuring a use pin of the integrated circuit to receive serial data at a rate of a clock signal applied to a clock pin of the integrated circuit; determining whether a test initialization bit sequence is received on the use pin; and when it is determined that the test initialization bit sequence was received on the use pin, operating the integrated circuit in a test mode, the operating including: configuring a set of latches of the integrated circuit in a shift register configuration to receive a test vector in series from the use pin; switching a transfer direction of the use pin to an output mode to output serial data at the rate of the clock signal; and coupling the set of latches in the shift register configuration to the use pin to output a test result set in series on the use pin, the responding, the determining and the operating the integrated circuit in the test mode being performed by the integrated circuit. In an embodiment, the transfer direction of the use pin is switched at each clock cycle to alternate input of a bit of the test vector and output of a bit of the test result set through the use pin. In an embodiment, the transfer direction of the use pin stays unchanged during a number of consecutive clock cycles corresponding to a test vector size. In an embodiment, switching of the transfer direction of the use pin is synchronized on a logic complement of the clock signal. In an embodiment, the method comprises: between an end of reception of the test vector and a beginning of provision of the test result set, performing a capture phase by reconfiguring the latches in a normal operation configuration during one or more clock cycles; and synchronizing a beginning and an end of the capture phase on a logic complement of the clock signal. In an embodiment, the integrated circuit determines a size of the test vector from information conveyed in the test initialization bit sequence. In an embodiment, the circuit determines a number of cycles of the capture phase from information conveyed in the test initialization bit sequence. In an embodiment, the method comprises receiving a series of test vectors and determining an end of a test based on a surplus bit conveyed in a test vector. In an embodiment, the method comprises: operating the integrated circuit in a self-test mode when it is determined that a self-test initialization bit sequence was received on the use pin, the operating the integrated circuit in the self-test mode including: performing a self-test according to parameters conveyed in the self-test initialization bit sequence; switching the transfer direction of the use pin to the output mode; and providing in series on the use pin a combination of values contained in one or more other latches of the integrated circuit. In an embodiment, the switching of the transfer direction and the coupling of the set of latches in the test mode is based on information contained in the test initialization sequence, and only the clock pin and the use pin are needed as input and output pins in a full test. In an embodiment, the method comprises organizing the switching of the transfer direction of the use pin and the connection of the shift register solely from information contained in the test initialization sequence, whereby the integrated circuit requires only two signal pins for permitting a full test. In an embodiment, the two signal pins are the clock pin and the use pin.

In an embodiment, an integrated circuit comprises: combinational logic; an input/output pin selectively configurable to input and output serial data; one or more power pins; a clock pin configured to receive a clock signal; and test-control circuitry configured to: respond to powering on of the integrated circuit by configuring the input/output pin to receive serial data at a rate of a clock signal applied to the clock pin; determine whether a test initialization bit sequence is received on the input/output pin; and when it is determined that the test initialization bit sequence was received on the input/output pin: configure a set of latches of the combinational logic in a shift register configuration to receive a test vector in series from the input/output pin; switch a transfer direction of the input/output pin to an output mode to output serial data at the rate of the clock signal; and couple the set of latches in the shift register configuration to the input/output pin to output a test result set in series. In an embodiment, the test control circuitry is configured to switch the transfer direction of the input/output pin at each clock cycle to alternate input of a bit of the test vector and output of a bit of the test result set through the input/output pin. In an embodiment, the test control circuitry is configured to maintain the transfer direction of the input/output pin during a number of consecutive clock cycles corresponding to a test vector size. In an embodiment, the test control circuitry is configured to synchronized switching of the transfer direction of the input/output pin on a logic complement of the clock signal. In an embodiment, the test control circuitry is configured to: between an end of reception of the test vector and a beginning of provision of the test result set, reconfigure the latches of the combinational logic in a normal operation configuration during a capture phase of one or more clock cycles; and synchronizing a beginning and an end of the capture phase on a logic complement of the clock signal. In an embodiment, the test control circuitry is configured to determine a size of the test vector from information conveyed in the test initialization bit sequence. In an embodiment, the test control circuitry is configured to determine a number of cycles of the capture phase from information conveyed in the test initialization bit sequence. In an embodiment, the test control circuitry is configured to determine an end of a test including receiving a series of test vectors based on a surplus bit conveyed in a test vector of the series of test vectors. In an embodiment, the test control circuitry is configured to: determine whether a self-test initialization bit sequence is received on the input/output pin; and when it is determined that a self-test initialization bit sequence was received on the input/output pin: perform a self-test according to parameters conveyed in the self-test initialization bit sequence; switch the transfer direction of the input/output pin to the output mode; and provide in series on the input/output pin a combination of values contained in one or more latches of the test control circuitry. In an embodiment, the test control circuitry comprises a finite state machine.

In an embodiment, an integrated circuit comprises: combinational logic; an input/output pin selectively configurable to input and output serial data; one or more power pins; a clock pin configured to receive a clock signal; means for detecting receipt of a test initialization bit sequence on the input/output pin; means for receiving test vectors on the input/output pin; means for testing the combinational logic using received test vectors; and means for outputting test results on the input/output pin. In an embodiment, the integrated circuit further comprises means for detecting a last test vector of a series of test vectors. In an embodiment, the integrated circuit further comprises: means for detecting receipt of a self-test initialization bit sequence on the input/output pin; means for perform a self-test according to parameters conveyed in a received self-test initialization bit sequence; means for providing self-test results on the input/output pin. In an embodiment, the pins of the integrated circuit consist of the input/output pin; the clock pin; a first power pin; and a second power pin.

In an embodiment, a system comprises: a clock configured to generate a clock signal; and an integrated circuit including: combinational logic; an input/output pin selectively configurable to input and output serial data; one or more power pins; a clock pin configured to receive the clock signal; and test-control circuitry configured to: respond to powering on of the integrated circuit by configuring the input/output pin to receive serial data at a rate of the clock signal applied to the clock pin; determine whether a test initialization bit sequence is received on the input/output pin; and when it is determined that the test initialization bit sequence was received on the input/output pin: configure a set of latches of the combinational logic in a shift register configuration to receive a test vector in series from the input/output pin; switch a transfer direction of the input/output pin to an output mode to output serial data at the rate of the clock signal; and couple the set of latches in the shift register configuration to the input/output pin to output a test result set in series. In an embodiment, the test control circuitry is configured to switch the transfer direction of the input/output pin at each clock cycle to alternate input of a bit of the test vector and output of a bit of the test result set through the input/output pin. In an embodiment, the test control circuitry is configured to synchronized switching of the transfer direction of the input/output pin on a logic complement of the clock signal. In an embodiment, the test control circuitry comprises a finite state machine.

In an embodiment, a non-transitory computer-readable medium's contents cause an integrated circuit to perform a method, the method comprising: responding to powering on of the integrated circuit by configuring a use pin of the integrated circuit to receive serial data at a rate of a clock signal applied to a clock pin of the integrated circuit; determining whether a test initialization bit sequence is received on the use pin; and when it is determined that the test initialization bit sequence was received on the use pin, operating the integrated circuit in a test mode, the operating including: configuring a set of latches of the integrated circuit in a shift register configuration to receive a test vector in series from the use pin; switching a transfer direction of the use pin to an output mode to output serial data at the rate of the clock signal; and coupling the set of latches in the shift register configuration to the use pin to output a test result set in series on the use pin. In an embodiment, the transfer direction of the use pin stays unchanged during a number of consecutive clock cycles corresponding to a test vector size. In an embodiment, switching of the transfer direction of the use pin is synchronized on a logic complement of the clock signal.

BRIEF DESCRIPTION OF SEVERAL VIEWS OF THE DRAWINGS

Other advantages and features will become more clearly apparent from the following description of particular embodiments provided for exemplary purposes only and represented in the appended drawings, in which:

FIG. 3 shows an example evolution of signals in the circuit of FIG. 2 upon power on;

DETAILED DESCRIPTION

In the following description, certain details are set forth in order to provide a thorough understanding of various embodiments of devices, methods and articles. However, one of skill in the art will understand that other embodiments may be practiced without these details. In other instances, well-known structures and methods associated with, for example, integrated circuits, flip-flops, combinational logic, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure or the claims.

The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not necessarily intended to convey any information regarding the actual shape of particular elements, and have been selected solely for ease of recognition in the drawings. Geometric references are not intended to refer to ideal embodiments. For example, a rectilinear-shaped feature or element does not mean that a feature or element has a geometrically perfect rectilinear shape.

Figure 2:
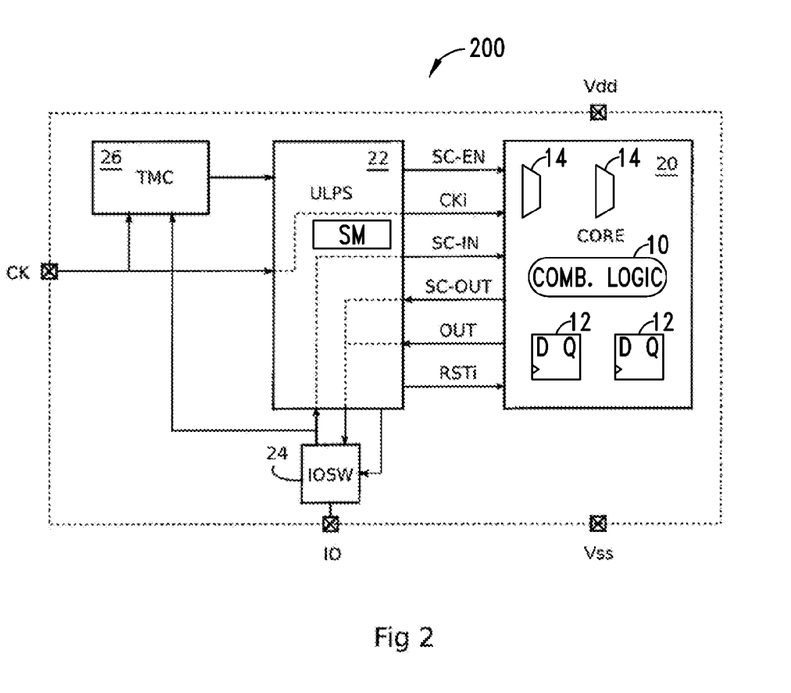
FIG. 2 schematically shows an internal architecture of a digital integrated circuit that may be scan-tested through two signal pins.

FIG. 2 schematically shows a digital integrated circuit 200 having only four pins, i.e., two power supply pins Vdd and Vss, a pin CK for applying a clock signal, and an input/output use pin IO having a switchable transfer direction (serial in or serial out). The digital functions to be scan-tested are concentrated in a core 20. Inside the circuit, the test will occur using the conventional five signals, i.e., scan-enable SC-EN to connect the latches of core 20 in a shift register configuration, scan-in SC-IN for introducing the test vectors, scan-out SC-OUT for extracting the test result sets, CKi to clock the shifting, and RSTi to reset the latches.

These five signals are managed by a control circuit 22, hereinafter called ULPS ("Ultra-Low Pin-count Scan-test"), which is configured to carry out, for example through a state machine SM, a particular protocol allowing the pin IO to convey all data exchanged with the exterior in order to perform a full scan-test of core 20.

The pin IO may be an input or an output, digital serial or analog. It is associated with a switch circuit 24 (IOSW) allowing circuit ULPS to switch pin IO between its normal operating mode (any mode) and a digital serial input mode, or a digital serial output mode. The incoming and outgoing signals of circuit 24 corresponding to the normal operating mode pass through circuit ULPS, which is configured to route the signals to the proper inputs or outputs of core 20. For example, if the normal function of core 20 is to provide an outgoing signal on pin IO, this output signal OUT from the core shares access to pin IO with signal SC-OUT.

A test mode configuration circuit 26 (TMC) is connected for receiving the serial incoming data of switch circuit 24, and is clocked by clock signal CK. It manages operation of circuit ULPS and may have a functionality similar to the TMC circuit described in U.S. Pat. No. 7,739,566.

In normal operation of the circuit 200, signal SC-EN is disabled (the latches of core 20 are not connected as a shift register), and the use pin IO is configured in its normal mode, for example for providing digital data in series. This serial data is routed directly to pin IO from core 20 by circuit IOSW. According to an alternative, core 20 may be designed for receiving serial digital data, in which case pin IO is configured in input mode, and the incoming external data is routed directly to the core. The clock signal CKi provided to the core may be, in this operating mode, a copy of the signal on pin CK.

The choice of performing a test of the circuit 200 or of configuring it in normal operation mode may happen when powering on the circuit 200. Upon power on, circuit ULPS configures pin IO in serial input mode and awaits a command from circuit TMC. The TMC awaits configuration information on pin IO, in the form of a bit sequence. If such a sequence is recognized, it is used for configuring the test through circuit TMC, and the test may start immediately. If no test information is recognized, the circuit 200 will typically operate in normal mode, for instance after a timeout or upon receiving a specific command on pin IO.

During the test, circuit ULPS configures the latches 12 of core 20 in a shift register configuration with signal SC-EN and causes exchange of test vectors and result sets between pin IO and core 20, by correspondingly switching the transfer direction (input or output) of pin IO.

The operation of the circuit 200 will be described in more detail hereinafter with the aid of drawings.

Figure 3:
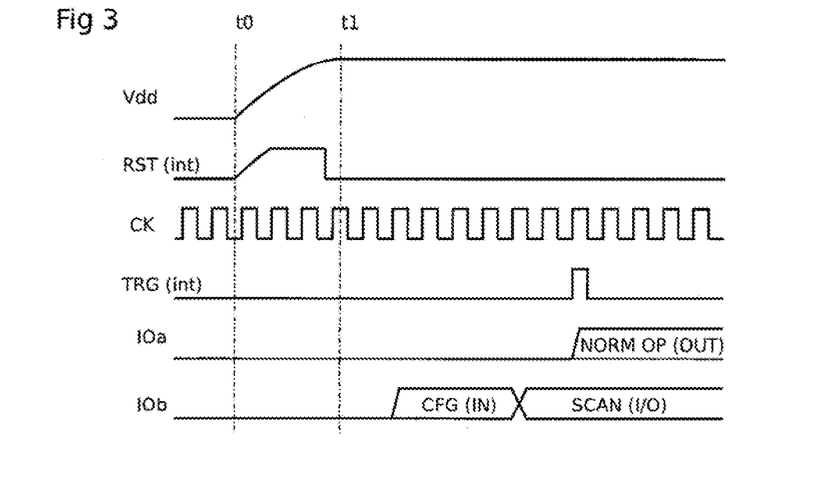

FIG. 3 shows the evolution of signals upon powering on the integrated circuit 200 and how the circuit switches to its test mode, if applicable. The Figure shows in particular the power supply voltage Vdd, the reset signal RST, the clock signal CK, a timeout trigger TRG, and two use cases of pin IO.

At a time t0, a power supply voltage is applied to the circuit. Voltage Vdd increases progressively to reach its nominal value at a time t1. At the beginning of this power-on phase, the signals have a tendency to vary randomly. The latches assume erratic states.

An internal power-on-reset circuit is designed to maintain the reset signal RST at its active value from the beginning of the power-on phase, until voltage Vdd is sufficient for a correct operation and the value of signal RST has effectively lasted long enough to cause a reset of all the latches of the circuit. This duration, ending before time t1, may be established by comparing voltage Vdd to a threshold.

Signal CK, provided for example by an external tester, is usually at its steady state as soon as the circuit is powered on.

As soon as signal RST is disabled, near time T1, circuit ULPS is ready to receive from circuit TMS a scan-test start signal.

Circuit TMS watches the signals on pin IO and attempts to identify a test initialization sequence at any clock cycle after reset.

Signals IOa in FIG. 3 correspond to an absence of test initialization sequence. In this case, a pulse TRG indicates, for example, a timeout defined for accepting an initialization sequence. Upon receiving the pulse, circuit ULPS configures pin IO in its normal mode, e.g., to communicate with core 20. The integrated circuit 200 starts operating in its normal mode.

According to an alternative, not using a timeout, circuit TMC may be configured to identify a sequence indicating an absence of test, causing the integrated circuit 200 to operate in its normal mode.

Signals IOb correspond to the arrival of an initialization sequence CFG, after time t1. As soon as this sequence is identified, it is used by circuit TMC for configuring the test parameters of core 20, and the test may start as soon as the sequence has been interpreted or, if desired, after waiting a fixed cycle count. By starting the test according to this rule, the external tester may take the end of the sequence as a synchronization reference.

The progress of a test phase is described hereinafter for an example structure described with relation to FIG. 4.

Figure 4:
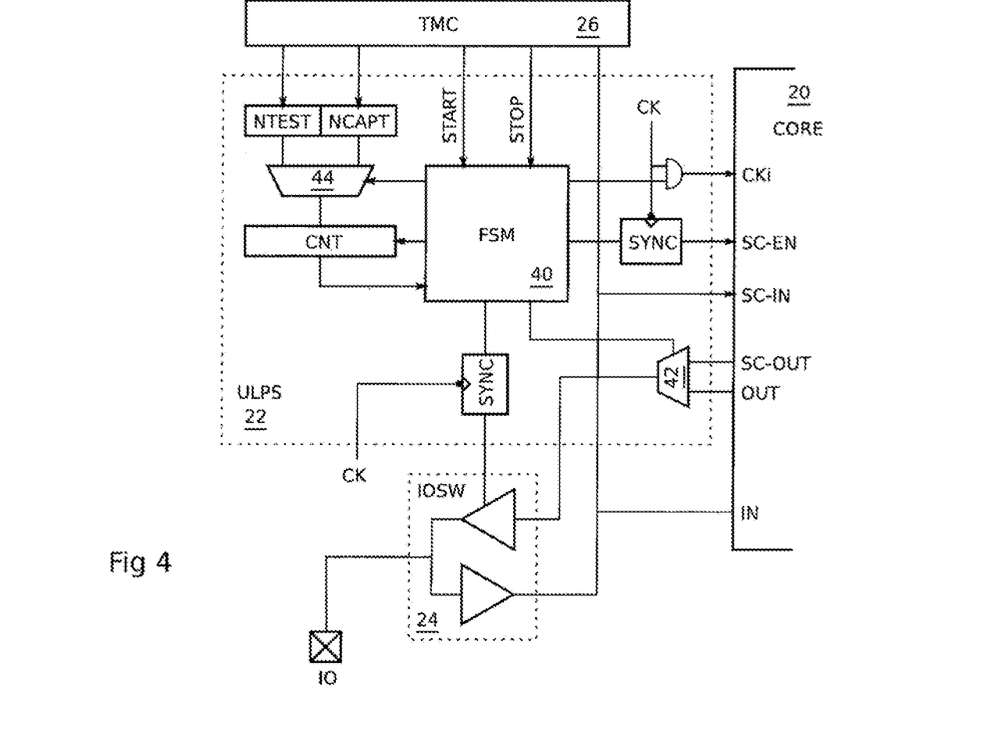
FIG. 4 shows a detailed example of elements of FIG. 2.

FIG. 4 schematically shows a more detailed embodiment of management circuit ULPS 22 and of switch circuit IOSW 26. Circuit ULPS comprises a state machine FSM 40 producing in particular the scan-enable signal SC-EN and the transfer direction selection signal of circuit IOSW. These two signals may be synchronized on the falling edges of clock CK by respective flip-flops SYNC clocked by the complement of clock signal CK. Hence, the active transitions of these signals SC-EN and IOSW are shifted by half a clock cycle with respect to the active transitions of the other signals of the circuit. The purpose of this will be understood later.

In the situation where the core 20 of the integrated circuit 200 is designed to produce an outgoing signal OUT in normal operation, circuit ULPS comprises a multiplexer 42 controlled by the state machine FSM for routing towards pin IO, either the signal SC-OUT conveying the test result sets from core 20, or the normal output signal OUT of the core.

Circuit IOSW comprises two buffer gates, one of which has a tri-state output enabled by the state machine. The input of the first buffer gate is connected to pin IO and its output provides the signal SC-IN conveying the test vectors, which signal is also received by circuit TMC; if core 20 is normally designed to receive an input signal IN from pin IO, this signal typically corresponds to signal SC-IN provided by circuit IOSW. The output of the second, tri-state gate is connected to pin IO and its input receives the output of multiplexer 42, while its high impedance command is provided by circuit ULPS.

Circuit ULPS moreover comprises a counter CNT which may be initialized, upon receiving a command from the state machine FSM, to one of two values NTEST and NCAPT provided by circuit TMC on inputs of circuit ULPS. A multiplexer 44 selects, upon command of the state-machine, one or the other of values NTEST and NCAPT for the counter. Counter CNT is designed to countdown each clock cycle CK and send a signal to the state-machine at the end of the countdown.

The values NTEST and NCAPT may be conveyed in the test initialization sequence provided upon power-on of the circuit. They may be extracted by circuit TMC and provided to circuit ULPS. Value NTEST corresponds to the bit count of the test vectors and value NCAPT corresponds to the cycle count of the capture phases. Value NTEST may in many applications be constant; it may then be hard-wired instead of being provided in the initialization sequence. Nevertheless, even if the length of the test vectors is constant, it may be useful to vary the length of the capture phases between tests.

A test may comprise a succession of test passes, each test pass corresponding to a test vector provision phase, followed (or not) by a capture phase, ending with a result set extraction phase. Values NTEST and NCAPT are thus provided at the beginning of a test for the ensemble of the test. With the teachings described up to now, the state-machine FSM would operate by looping infinitely through test passes with the same parameters NTEST and NCAPT. In this case, it may be devised to interrupt the test and change parameters NTEST and NCAPT by powering off the circuit and powering it back on to provide a new test initialization sequence with different parameters (or, if testing is no longer required, to switch the circuit to normal operation).

It is preferable to be able to change the test parameters without going through a power-off phase of the circuit, which significantly increases the testing time. The elements described hereafter facilitate changing parameters between tests without going through power-off phases.

As shown, the state-machine FSM receives from circuit TMC a test start command START and a test end command STOP. The START command is issued when circuit TMC recognizes a test initialization sequence on pin IO, such as upon power-on.

Circuit TMC issues the STOP command when it recognizes a specific stop signature in a currently fed test vector. In response to this STOP command, the state-machine interrupts the current test phase, switches pin IO to input mode, causes a reset of the whole circuit (except of the state machine), and stops to await a new START command. Circuit TMC awaits a new initialization sequence on pin IO, like when the circuit is freshly powered-on. In contrast, since the synchronization with the tester has not been lost, the tester may send the new initialization sequence immediately after the vector conveying the stop signature. As soon as this new initialization sequence is recognized, circuit TMC provides new parameters NTEST and NCAPT to the state-machine and triggers the state machine 40 with the START command. At this stage, it may also be decided that the test is finished, and the circuit 200 may be switched to its normal operating mode.

In the operating mode that has just been described, the vector conveying the stop signature is not used for achieving a new test pass. Even if the transmission time of such a vector for causing test interruption is negligible with respect to resetting the circuit through powering it off, it may be desirable to exploit this vector for a last test pass. Thus, according to an alternative embodiment, the state-machine may be designed to exploit this vector in a last test pass. In reply to the STOP command, the state-machine stops after having performed the capture phase and the corresponding result set provision phase.

It appears difficult to choose a particular test vector that can serve to convey an end-test signature, especially if this vector should be identical for different types of circuits. Indeed, this vector would typically be chosen to not correspond to a useful test vector; if the vector is not useful for testing one type of circuit, it may however be useful for testing another type of circuit.

In order to avoid this difficulty, we devise to add a surplus stop bit to the test vectors, which indicates the end of test by a corresponding value, say "1". The test vector is thus longer, by one bit, than the shift register of the original core 20 to test.

Preferably the shift register comprises an additional latch to receive the stop bit. This latch is placed at the head or the tail of the shift register, depending on whether the stop bit is placed at the head or the tail of the test vector. The state of this additional latch is then also extracted with the test result set, but the tester may ignore it.

According to an embodiment, the stop bit is placed at the tail of the test vector and no additional latch is provided for it in the shift register. The size of the shift register and the effective size of the test vector being equal to N=NTEST, the extended vector is received in N+1 cycles. Since the capture phase is started upon receiving the last, N-th, bit of the effective test vector, the latches of the core are in their normal operating mode when the (N+1)-th surplus bit arrives. This surplus bit thus does not affect the content of the shift register, but pin IO still being in input mode, it is seen and interpreted by circuit TMC.

According to another alternative embodiment, the stop bit is placed at the head of the test vector, and it is considered that the size of the vector is NTEST=N+1, whereas the size of the shift register is N. At the (N+1)-th cycle, the stop bit is pushed outside the shift register, and ignored, while the shift register then contains the desired test vector. In this case, counter CNT receives value NTEST-1 for the result set extraction phases.

Figure 5:
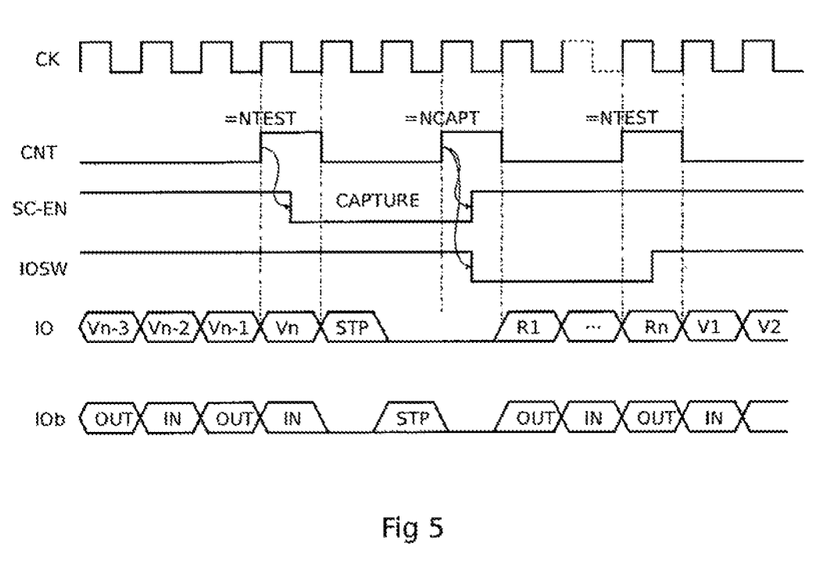
FIG. 5 is a time diagram showing two embodiments of a scan test for a circuit of the type of FIG. 4.

FIG. 5 is a time diagram illustrating an exemplary test procedure. It shows the evolution of clock signal CK, of the command provided by the counter CNT to the state-machine, of scan-enable signal SC-EN, of the transfer direction command for circuit IOSW, and of the signals exchanged via pin IO.

Upon enabling the START signal by circuit TMC (event not shown), counter CNT receives value NTEST. Pin IO is switched to input mode, which is shown by signal IOSW at 1, and signal SC-EN is enabled, configuring the latches of core 20 in shift register mode. At each pulse of clock CK, a new bit V1 . . . Vn of the test vector, presented on pin IO, is transferred into the shift register by scan-in line SC-IN (FIG. 4).

When the counter has counted down value NTEST, it provides a pulse to the state-machine. The state-machine loads value NCAPT in the counter and disables signal SC-EN to switch the core to its normal operating mode and achieve a capture phase. At this stage, the ensemble of vector V1 . . . Vn has been transferred into the latches of core 20, connected in a shift register configuration. While the bits of this vector were shifted into the register through line SC-IN, the bits that were present in the register were pushed out of the register through line SC-OUT, connected to nothing. These outgoing bits, in fact corresponding to nothing useful, are thus ignored.

If signal SC-EN were synchronized with the rising edges of clock CK, it would toggle at the next rising edge of clock CK, i.e., simultaneously with the first capture cycle; the latches would be controlled to lock the states present at their inputs, while these inputs would be in a transition phase. The latches would assume random states which would falsify the subsequent capture cycles.

It is to avoid this issue that signal SC-EN is synchronized on the falling edges of clock CK. Hence signal SC-EN toggles half a cycle after the pulse issued by counter CNT, i.e., half a period before the first capture cycle, leaving enough headroom for the latch inputs to switch before the beginning of the first capture cycle.

The direction of pin IO is irrelevant during the capture phase; it is assumed here that it stays in input mode. The surplus stop bit STP of the test vector may thus be received, according to one of the above disclosed alternatives, in order to indicate an end of test to circuit TMC.

When counter CNT has counted down value NCAPT, a new pulse is provided to the state-machine, indicating the end of the capture phase. Value NTEST is again loaded in the counter, and signal SC-EN is again enabled, this time to extract the test result set R1 . . . Rn from the shift register. Signal SC-EN is in effect enabled half a period after the pulse from counter CNT, i.e., half a period before the extraction of the first bit R1 of the result set, ensuring that the latches have sufficient time to switch into their shift register configuration before an attempt to extract the first bit.

Signal IOSW also toggles in response to the pulse from counter CNT, in order to switch the transfer direction of pin IO to output mode. Since this signal is also synchronized on the falling edges of clock CK, it switches to 0 simultaneously with signal SC-EN switching to 1, i.e., half a period before the extraction of the first bit R1 of the result set. This leaves sufficient time for the new configuration of pin IO to stabilize, so that pin IO can present a clean value of bit R1. If signal IOSW were synchronized on the rising edges of clock CK, the direction switching of pin IO would occur simultaneously with the extraction of the first bit R1, almost certainly causing a sampling error for the tester.

While the result set bits are extracted, new bits conveyed on line SC-IN, which is disconnected, are shifted into the register. These bits correspond to nothing useful, and are in fact those that will be extracted, but ignored, upon writing the next test vector. They may therefore be rendered all equal to a default value chosen to minimize interference with the operation of the circuit during the result set extraction.

When counter CNT has counted down value NTEST, a new pulse is provided to the state-machine. Value NTEST is again loaded into the counter. The extraction of the result set is finished and a new test vector may be provided according to the conditions described in relation with the beginning of the time diagram. Signal SC-EN stays enabled to maintain the latches of the core in their shift register configuration. Signal IOSW however toggles to switch the direction of pin IO to its input mode. Signal IOSW, synchronized on the falling edges of clock CK, switches half a period after the pulse from counter CNT, i.e., half a period before sampling the first bit V1 of the new vector. This leaves sufficient time for pin IO to assume its new configuration, allowing sampling of a clean value of the first bit V1 of the vector.

According to a second alternative, illustrated by signal IOb on the use pin, the provision of a bit (IN) of the test vector and the extraction of a bit (OUT) of the result set alternate at the rate of clock CK. The current result set corresponds to the capture phase performed for the vector of the previous pass. In this manner, as a new vector is shifted into the register, the result set of the previous pass is shifted out of the register. If the vector conveys a stop bit STP, it is introduced through pin IO at the second cycle of the capture phase, like a bit pertaining to the test vector, but it is not shifted into the register (according to one of the above described alternatives for processing the stop bit).

The state-machine correspondingly alternates the direction of the use pin IO between the input mode, while routing the incoming bits to line SC-IN of the core, and the output mode, while routing the outgoing bits of line SC-OUT to pin IO. The shift register in the core thus operates with a clock CKi at half the rate of clock CK.

A shift register shifts-in a bit at its tail at the same time it shifts-out a bit at its head. These two bits, one incoming and the other outgoing, cannot be transferred at the same time over the sole pin IO. Due to the fact that the bits of the test vector and of the result set are conveyed at half the clock frequency, each outgoing bit happens to be present during two clock cycles for extraction through pin IO; this outgoing bit is, for instance, output upon the first clock cycle, and the incoming bit is sampled-in upon the second clock cycle.

We have up to now disclosed testing of the core 20. It is of course desirable to also test the ULPS circuit itself. For this purpose, it may be provided with a built-in self-test (BIST) system designed to transmit through pin IO a test result at the end of a dedicated self-test pass. This self-test pass may be selected trough the initialization sequence provided by the tester on pin IO upon power-on.

The self-test may consist in loading into counter CNT a value conveyed in the initialization sequence and in dry running the state-machine FSM to make it count down the counter by a specific value. The values of the flip-flops of circuit ULPS, including those of the counter, are then combined and provided in a serial data stream on pin IO. The combination may consist of a signature calculation on the values of the flip-flops.

Some embodiments may take the form of or comprise computer program products. For example, according to one embodiment there is provided a computer readable medium comprising a computer program adapted to perform one or more of the methods or functions described above. The medium may be a non-transitory medium such as a physical storage medium, for example, a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), digital signal processors, discrete circuitry, logic gates, state machines, standard integrated circuits, controllers (e.g., programmed by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method, comprising:
responding to powering on of an integrated circuit by configuring a use pin of the integrated circuit to receive serial data at a rate of a clock signal applied to a clock pin of the integrated circuit;
determining whether a test initialization bit sequence is received on the use pin; and
when it is determined that the test initialization bit sequence was received on the use pin, operating the integrated circuit in a test mode, the operating including:
configuring a set of latches of the integrated circuit in a shift register configuration to receive a test vector in series from the use pin;
switching a transfer direction of the use pin to an output mode to output serial data at the rate of the clock signal; and
coupling the set of latches in the shift register configuration to the use pin to output a test result set in series on the use pin, the responding, the determining and the operating the integrated circuit in the test mode being performed by the integrated circuit.

2. The method of claim 1 wherein the transfer direction of the use pin is switched at each clock cycle to alternate input of a bit of the test vector and output of a bit of the test result set through the use pin.

3. The method of claim 1 wherein the transfer direction of the use pin stays unchanged during a number of consecutive clock cycles corresponding to a test vector size.

4. The method of claim 1 wherein switching of the transfer direction of the use pin is synchronized on a logic complement of the clock signal.

5. The method of claim 1, comprising:
between an end of reception of the test vector and a beginning of provision of the test result set, performing a capture phase by reconfiguring the latches in a normal operation configuration during one or more clock cycles; and
synchronizing a beginning and an end of the capture phase on a logic complement of the clock signal.

6. The method of claim 5 wherein the circuit determines a number of cycles of the capture phase from information conveyed in the test initialization bit sequence.

7. The method of claim 1 wherein the integrated circuit determines a size of the test vector from information conveyed in the test initialization bit sequence.

8. The method of claim 1, comprising receiving a series of test vectors and determining an end of a test based on a surplus bit conveyed in a test vector.

9. The method of claim 1, comprising:
operating the integrated circuit in a self-test mode when it is determined that a self-test initialization bit sequence was received on the use pin, the operating the integrated circuit in the self-test mode including:
performing a self-test according to parameters conveyed in the self-test initialization bit sequence;
switching the transfer direction of the use pin to the output mode; and
providing in series on the use pin a combination of values contained in one or more other latches of the integrated circuit.

10. The method of claim 1 wherein the switching of the transfer direction and the coupling of the set of latches in the test mode is based on information contained in the test initialization sequence, and only the clock pin and the use pin are needed as input and output pins in a full test.

11. An integrated circuit, comprising:
combinational logic;
an input/output pin selectively configurable to input and output serial data;
one or more power pins;
a clock pin configured to receive a clock signal; and
test-control circuitry configured to:
respond to powering on of the integrated circuit by configuring the input/output pin to receive serial data at a rate of a clock signal applied to the clock pin;
determine whether a test initialization bit sequence is received on the input/output pin; and
when it is determined that the test initialization bit sequence was received on the input/output pin:
configure a set of latches of the combinational logic in a shift register configuration to receive a test vector in series from the input/output pin;
switch a transfer direction of the input/output pin to an output mode to output serial data at the rate of the clock signal; and
couple the set of latches in the shift register configuration to the input/output pin to output a test result set in series.

12. The integrated circuit of claim 11 wherein the test control circuitry is configured to switch the transfer direction of the input/output pin at each clock cycle to alternate input of a bit of the test vector and output of a bit of the test result set through the input/output pin.

13. The integrated circuit of claim 11 wherein the test control circuitry is configured to maintain the transfer direction of the input/output pin during a number of consecutive clock cycles corresponding to a test vector size.

14. The integrated circuit of claim 11 wherein the test control circuitry is configured to synchronized switching of the transfer direction of the input/output pin on a logic complement of the clock signal.

15. The integrated circuit of claim 11 wherein the test control circuitry is configured to:
between an end of reception of the test vector and a beginning of provision of the test result set, reconfigure the latches of the combinational logic in a normal operation configuration during a capture phase of one or more clock cycles; and
synchronizing a beginning and an end of the capture phase on a logic complement of the clock signal.

16. The integrated circuit of claim 11 wherein the test control circuitry is configured to determine a size of the test vector from information conveyed in the test initialization bit sequence.

17. The integrated circuit of claim 16 wherein the test control circuitry is configured to determine a number of cycles of the capture phase from information conveyed in the test initialization bit sequence.

18. The integrated circuit of claim 11 wherein the test control circuitry is configured to determine an end of a test including receiving a series of test vectors based on a surplus bit conveyed in a test vector of the series of test vectors.

19. The integrated circuit of claim 11 wherein the test control circuitry is configured to:
determine whether a self-test initialization bit sequence is received on the input/output pin; and
when it is determined that a self-test initialization bit sequence was received on the input/output pin:
perform a self-test according to parameters conveyed in the self-test initialization bit sequence;
switch the transfer direction of the input/output pin to the output mode; and
provide in series on the input/output pin a combination of values contained in one or more latches of the test control circuitry.

20. The integrated circuit of claim 11 wherein the test control circuitry comprises a finite state machine.

21. The integrated circuit of claim 11 wherein the pins of the integrated circuit consist of the input/output pin; the clock pin; a first power pin; and a second power pin.

22. A system, comprising:
a clock configured to generate a clock signal; and
an integrated circuit including:
combinational logic;
an input/output pin selectively configurable to input and output serial data;
one or more power pins;
a clock pin configured to receive the clock signal; and
test-control circuitry configured to:
respond to powering on of the integrated circuit by configuring the input/output pin to receive serial data at a rate of the clock signal applied to the clock pin;
determine whether a test initialization bit sequence is received on the input/output pin; and when it is determined that the test initialization bit sequence was received on the input/output pin:
configure a set of latches of the combinational logic in a shift register configuration to receive a test vector in series from the input/output pin;
switch a transfer direction of the input/output pin to an output mode to output serial data at the rate of the clock signal; and
couple the set of latches in the shift register configuration to the input/output pin to output a test result set in series.

23. The system of claim 22 wherein the test control circuitry is configured to switch the transfer direction of the input/output pin at each clock cycle to alternate input of a bit of the test vector and output of a bit of the test result set through the input/output pin.

24. The system of claim 22 wherein the test control circuitry is configured to synchronized switching of the transfer direction of the input/output pin on a logic complement of the clock signal.

25. The system of claim 22 wherein the test control circuitry comprises a finite state machine.

26. A non-transitory computer-readable medium whose contents cause an integrated circuit to perform a method, the method comprising:

responding to powering on of the integrated circuit by configuring a use pin of the integrated circuit to receive serial data at a rate of a clock signal applied to a clock pin of the integrated circuit;
determining whether a test initialization bit sequence is received on the use pin; and
when it is determined that the test initialization bit sequence was received on the use pin, operating the integrated circuit in a test mode, the operating including:
configuring a set of latches of the integrated circuit in a shift register configuration to receive a test vector in series from the use pin;
switching a transfer direction of the use pin to an output mode to output serial data at the rate of the clock signal; and
coupling the set of latches in the shift register configuration to the use pin to output a test result set in series on the use pin.

27. The computer-readable medium of claim 26 wherein the transfer direction of the use pin stays unchanged during a number of consecutive clock cycles corresponding to a test vector size.

28. The computer-readable medium of claim 26 wherein switching of the transfer direction of the use pin is synchronized on a logic complement of the clock signal.

* * * * *